(12) United States Patent
Lee et al.

(10) Patent No.: US 9,530,668 B2
(45) Date of Patent: Dec. 27, 2016

(54) THIN-FILM PATTERN ARRAY AND PRODUCTION METHOD THEREFOR

(71) Applicant: Foundation of Soongsil University-Industry Cooperation, Seoul (KR)

(72) Inventors: Hojin Lee, Seoul (KR); Youngseok Kim, Seoul (KR)

(73) Assignee: Foundation of Soongsil University-Industry Cooperation, Seoul (KR)

( * ) Notice: Subject to any disclaimer, the term of this patent is extended or adjusted under 35 U.S.C. 154(b) by 0 days.

(21) Appl. No.: 14/904,384

(22) PCT Filed: Aug. 30, 2013

(86) PCT No.: PCT/KR2013/007839
§ 371 (c)(1),
(2) Date: Jan. 11, 2016

(87) PCT Pub. No.: WO2015/005527
PCT Pub. Date: Jan. 15, 2015

(65) Prior Publication Data
US 2016/0141185 A1    May 19, 2016

(30) Foreign Application Priority Data
Jul. 11, 2013  (KR) .......................... 10-2013-0081351

(51) Int. Cl.
*H01L 29/51* (2006.01)
*H01L 21/311* (2006.01)
*H01L 29/423* (2006.01)
*H01L 27/12* (2006.01)
*H01L 29/06* (2006.01)

(52) U.S. Cl.
CPC ..... *H01L 21/31144* (2013.01); *H01L 27/1244* (2013.01); *H01L 29/0657* (2013.01); *H01L 29/42384* (2013.01); *H01L 29/512* (2013.01)

(58) Field of Classification Search
CPC ..................... H01L 29/0657; H01L 21/31144
See application file for complete search history.

(56) References Cited

U.S. PATENT DOCUMENTS

| | | | |
|---|---|---|---|
| 5,723,371 A | 3/1998 | Seo et al. | |
| 5,825,050 A | 10/1998 | Hirakawa | |

FOREIGN PATENT DOCUMENTS

| | | | |
|---|---|---|---|
| JP | S632353 A | 1/1988 | |
| JP | H0529450 A | 2/1993 | |
| JP | 2005-217115 A | 8/2005 | |
| JP | 2007-142382 A | 6/2007 | |
| KR | 10-1991-0007512 B1 | 9/1991 | |

(Continued)

*Primary Examiner* — Eugene Lee
(74) *Attorney, Agent, or Firm* — Novick, Kim & Lee, PLLC; Sang Ho Lee

(57) ABSTRACT

Disclosed are: a thin-film pattern array able to minimize level differences between thin films; and a production method therefor. The thin-film pattern array comprises: a lower thin-film pattern which is positioned on a substrate; an upper thin-film pattern which is positioned on the upper edge of the lower thin-film pattern; and a level-difference attenuating pattern which is positioned between the lower thin-film pattern and the upper thin-film pattern, and has a gentle taper angle so as to be able to reduce the level difference between the lower thin-film pattern and the upper thin-film pattern.

12 Claims, 7 Drawing Sheets

(56) References Cited

FOREIGN PATENT DOCUMENTS

| KR | 10-1992-0017226 A | 9/1992 |
| --- | --- | --- |
| KR | 10-1994-0025032 A | 11/1994 |
| KR | 10-1998-0010558 A | 4/1998 |
| KR | 10-2000-0002799 A | 1/2000 |
| KR | 10-2010-0005723 A | 1/2010 |

THIN-FILM PATTERN ARRAY AND PRODUCTION METHOD THEREFOR

TECHNICAL FIELD

The following description relates to a thin film pattern array capable of improving reliability and a method of manufacturing the same.

BACKGROUND ART

Generally, mobile devices, display devices, semiconductor devices, and switching devices, etc. include a plurality of thin film patterns, and the thin film patterns are formed by a photolithography process and an etching process.

A thin film pattern array includes a lower thin film pattern formed on a substrate and an insulating layer formed on the lower thin film pattern using a deposition method, etc. such as plasma-enhanced chemical vapor deposition (PE-CVD). An upper thin film pattern which is electrically insulated from the lower thin film pattern is formed on the insulating layer. The lower and upper thin film patterns are formed by the photolithography process and the etching process. Here, an end portion of each of the thin film patterns has a nearly vertical taper angle. As a result, the insulating layer formed around the end portion of each of the thin film patterns also has the nearly vertical taper angle close. When forming the upper thin film pattern on the structure described above, the width of the upper thin film pattern becomes thin or the upper thin film pattern is cut where a step difference is generated. When the width of the thin film pattern becomes too thin, resistance becomes locally increased, and heating occurs which causes complications. Further, if the upper thin film pattern is cut another complication can occur when the electrical signal becomes abnormally transmitted. Additionally, when the insulating layer is cut, a short-circuit complication occurs due to the lower thin film pattern and the upper thin film pattern coming into contact with each other.

In order to solve these complications, various conventional methods have been proposed. First, a method of forming the taper angle by controlling the material property, composition ratio, temperature, etc. of an etchant (or gas) has been proposed. However, it is difficult to form a specific taper angle since the method is sensitive to changes of a material, a deposition method, a thickness, etc. of the thin film.

Next, a method using an adhesion property of a thin film and photoresist has been proposed. However, it is difficult to perform a normal process due to a low adhesion property of the photoresist.

DISCLOSURE

Technical Problem

An aspect of the present invention is aimed towards providing a thin film array capable of creating a uniform width of the thin film by minimizing a step difference generated in a stack structure of thin film patterns and preventing a short-circuit between thin films and a method of manufacturing the same.

Technical Solution

Another aspect of the present invention provides a thin film pattern array including: a lower thin film pattern located on a substrate, an upper thin film pattern located above the lower thin film pattern, and a step difference alleviation pattern located between the lower thin film pattern and the upper thin film pattern that has a gradual taper angle to alleviate a possible step difference between the lower thin film pattern and the upper thin film pattern.

The step difference alleviation pattern may include a horizontal portion overlapping with the lower thin film pattern, an inclined portion connected to the horizontal portion which extends in the outside direction of the lower thin film pattern, and an edge portion connected to the inclined portion in contact with the substrate.

The thin film pattern array may further include an insulating layer located between the lower thin film pattern and the step difference alleviation pattern which electrically separates the lower thin film pattern and the upper thin film pattern. An insulating layer may also be formed to cover the lower thin film pattern and the step difference alleviation pattern.

The step difference alleviation pattern may include an anti-reflection material or an adhesive material.

The step difference alleviation pattern may include at least one of silicon nitride (SiNx) and silicon oxide ($SiO_2$).

Another aspect of the present invention provides a method of manufacturing a thin film pattern array including: a process of sequentially forming a first thin film and a second thin film on a substrate, a process of forming a step difference alleviation pattern by patterning the second thin film; and a process of forming a lower thin film pattern covered by the step difference alleviation pattern by patterning the first thin film.

The process where the lower thin film pattern is formed may include a phase of forming the lower thin film pattern having a line width smaller than the line width of the step difference alleviation pattern by selectively and excessively etching the first thin film.

The process of forming the step difference alleviation pattern may include: a step of forming a photoresist pattern on the second thin film by a photolithography process and a process of removing a portion which does not overlap with the photoresist pattern in the second thin film using the photoresist pattern as a mask.

The method of manufacturing the thin film pattern array may further include: a process of forming an insulating layer on the step difference alleviation pattern and a process of forming an upper thin film pattern located on the insulating layer and electrically separated from the lower thin film pattern.

The method of manufacturing the thin film pattern array may further include: a process of forming an upper thin film pattern located on the step difference alleviation pattern and electrically connected to the lower thin film pattern.

The step difference alleviation pattern may include a horizontal portion overlapping with the lower thin film pattern, an inclined portion connected to the horizontal portion that extends in the outside direction of the lower thin film pattern, and an edge portion connected to the substrate and in contact with the substrate.

Advantageous Effects

As described above, an aspect of the present invention can create thin films with uniform width by forming a step difference alleviation pattern capable of alleviating a step difference between the thin films which are stacked in order to prevent a short-circuit between the thin films.

MODES OF THE INVENTION

Figure 1:
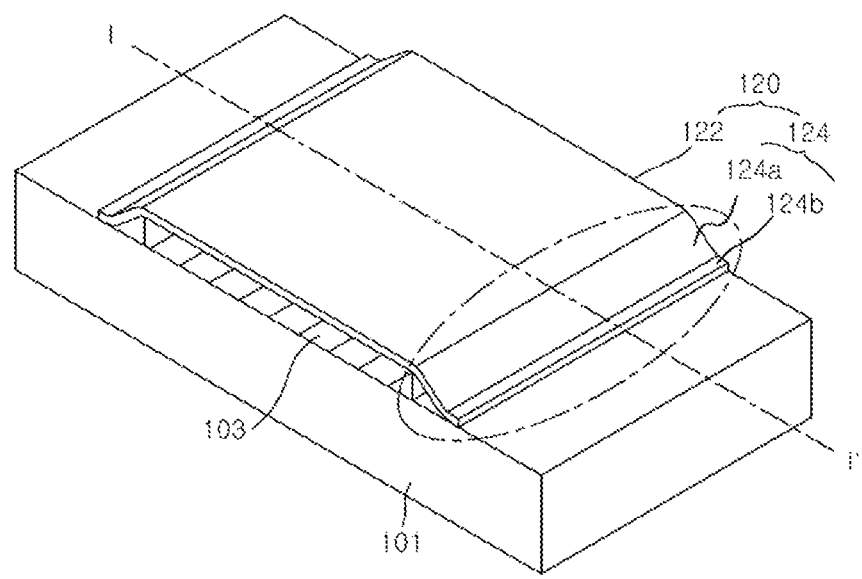
FIG. 1 is a perspective view illustrating a thin film array according to one embodiment of the present invention.

Going forward, embodiments of the present invention will be described in detail with reference to the accompanying drawings. When including reference numerals for the components shown in each drawing, the same reference numeral is used for the same component even when the same component is shown in another drawing.

Figure 2:
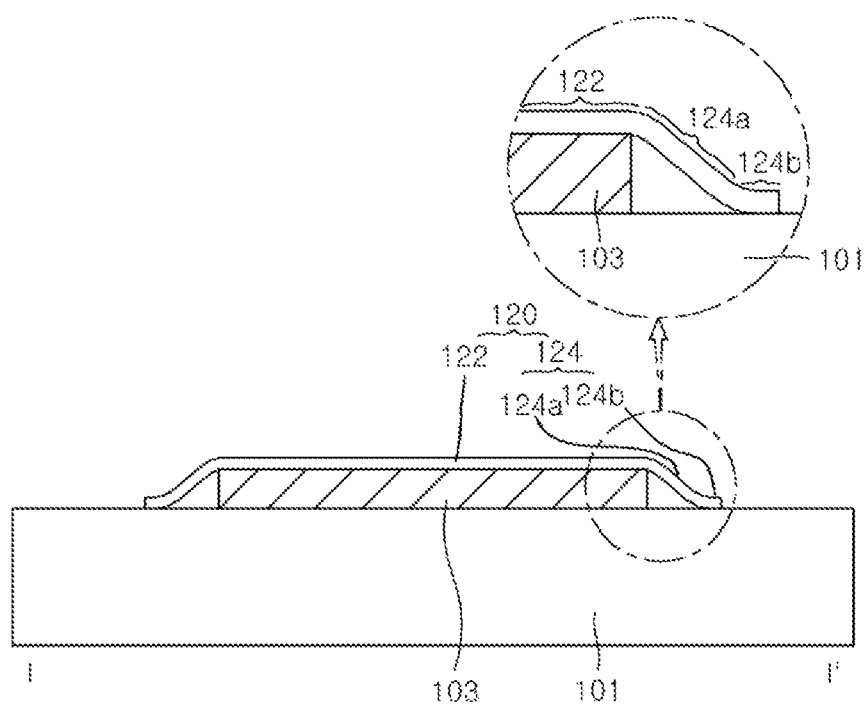
FIG. 2 is a cross-sectional view taken along a line I-I' of FIG. 1.

FIG. 1 is a perspective view illustrating a thin film array according to one exemplary embodiment of the present invention. FIG. 2 is a cross-sectional view taken along a line I-I' of FIG. 1.

The thin film pattern array shown in FIGS. 1 and 2 include a lower thin film pattern 103 formed on a substrate 101, and a step difference alleviation pattern 120 covering the lower thin film pattern 103 and extended outward from an end segment of the lower thin film pattern. The step difference alleviation pattern 120 may include a horizontal segment overlapping with the lower thin film pattern 103 and a relief portion 124 extended from the horizontal segment that has a gradual taper angle. The relief segment 124 includes an inclined segment 124a connected to the horizontal segment 122 and having a gradual slope and an edge segment 124b connected to the inclined segment 124a and directly connected to the substrate 101. The step difference alleviation pattern 120 having the structure described above performs the function of minimizing structural instability in which the upper thin film pattern which will be described going forward becomes thin or is cut by an abrupt step difference generated by the lower thin film pattern 103. This will be described in detail with reference to FIG. 3.

Figure 3:
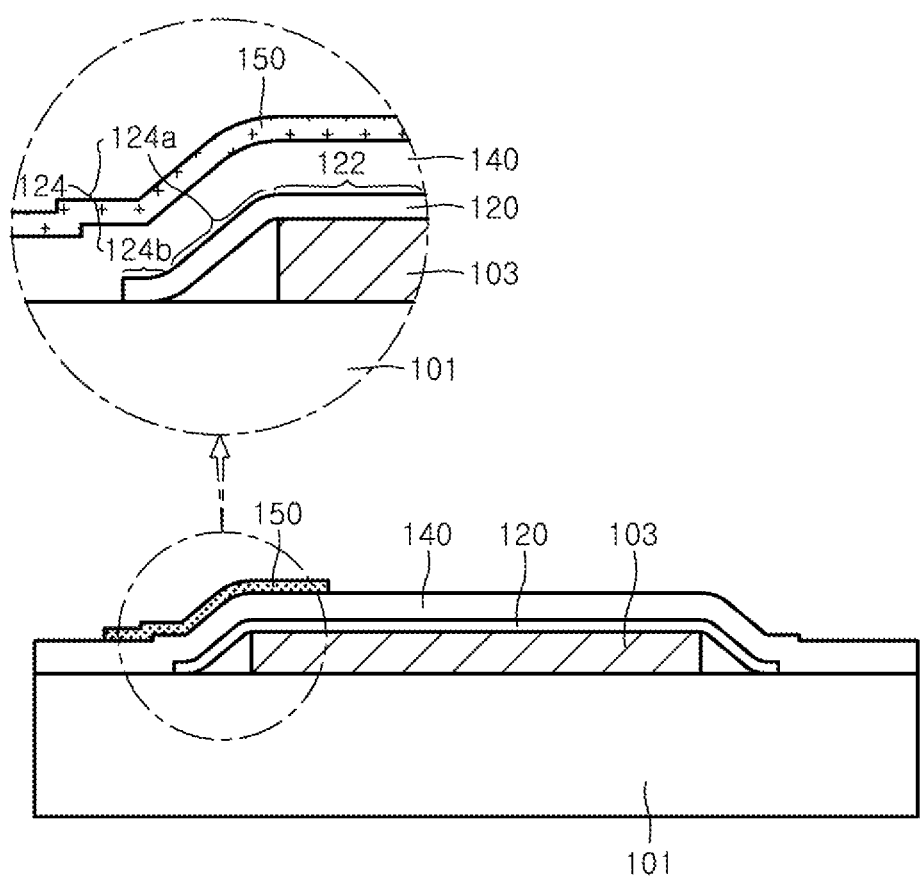
FIG. 3 is a cross-sectional view illustrating a thin film array in which an insulating layer and an upper thin film pattern are further included in the structure of FIG. 2.

FIG. 3 illustrates the thin film pattern array in which an insulating layer 140 formed on the substrate 101 where the step difference alleviation pattern 120 is located. Also included is an upper thin film pattern 150 located on the insulating layer 140. The alleviation segment 124 of the step difference alleviation pattern 120 performs a function of alleviating a step difference between the upper thin film pattern 150 and the lower thin film pattern 103. In more detail, the attractive force toward the substrate 101 such as a van der Waals force, a Casimir force, and a capillary force between the edge segment 124b and substrate 101 and a restoration force that tries to restore to an original state (a force that maintains a flat beam shape) are generated. Therefore, the inclined segment 124a located between the edge segment 124b and the horizontal segment 122 may maintain a gradual taper angle (or an angle of inclination) while not being directly in contact with substrate 101 since the restoration force maintaining the original state and the force pulling to the substrate 101 are parallel. Simultaneously, an empty space between the inclined portion 124a and the substrate 101 is formed.

As a result, the insulating layer 140 located on step difference alleviation pattern 120 does not have an abrupt step difference and the upper thin film pattern 150 formed on the insulating layer 140 may be also formed to have a uniform thickness without the abrupt step difference. Consequently, a heating problem due to the resistance generated by the step difference does not occur; and the electrical signal is also transmitted normally since the upper thin film pattern 150 is not cut and is formed normally thus, the reliability of the thin film pattern array is improved.

From this point, a method of manufacturing the thin film array shown in FIG. 2 will be described with reference to FIGS. 4A to 4F.

Figure 4A:
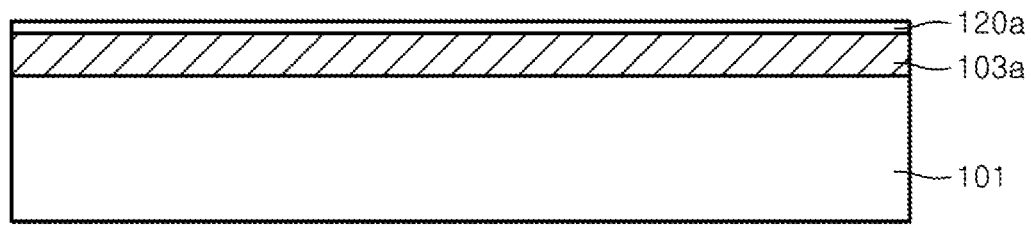
FIGS. 4A to 4F are cross-sectional views that sequentially illustrate a method of manufacturing a thin film array according to an embodiment of the present invention.

Referring to FIG. 4A, first thin film 103a is formed on the substrate 101 using a deposition method such as a sputtering method, etc., and a second thin film 120a for establishing the step difference alleviation pattern is formed. Here materials of the first thin film 103a and the second thin film 120a are different from each other. The first thin film 103a and the second thin film 120a may be sequentially deposited through a one-time vacuum process using the same apparatus. The second thin film 120a may include an anti-reflection material in order to prevent unnecessary reflection when performing a photolithography process and also include an adhesive material in order to improve an adhesion force.

Meanwhile, the anti-reflection material may be included in order to prevent the unnecessary reflection when performing the photolithography process on a lower segment of the first thin film 103a, and the adhesive material may be included in order to improve the adhesion force (not shown in the drawing).

Additionally, the material of the second thin film 120a may be formed by way of an inorganic insulating material such as silicon nitride (SiNx), silicon oxide ($SiO_2$), etc. using the deposition method such as a plasma-enhanced chemical vapor deposition (PE-CVD). The substrate 101 may be a glass substrate, an aluminum oxide substrate, a polymer-based substrate, etc. as well as a silicon wafer substrate. The material of the first thin film 103a may be aluminum, copper, titanium, chrome, molybdenum, indium tin oxide (ITO), tin oxide (TO), or indium zinc oxide (IZO).

Figure 4B:
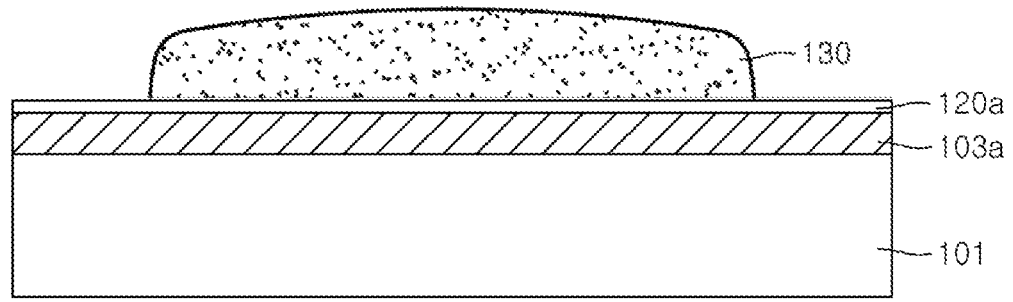

Referring to FIG. 4B, the first thin film 103a and the second thin film 120a are sequentially formed by a deposition process. After this, the photolithography process, including exposure and development processes using a mask, is performed after the photoresist is applied. Thus, the photoresist pattern 130 is formed on the second thin film 120a.

Figure 4C:
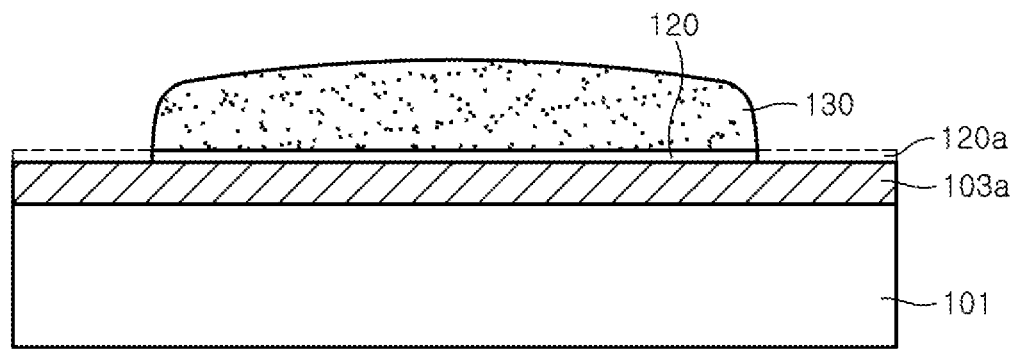

Referring to FIG. 4C, as the etching process using the photoresist pattern 130 as the mask is performed, the segments of the second thin film 120a which does not overlap with the photoresist pattern 130 may be removed. Here, the second thin film 120a is selectively etched by an etchant or an etching gas used for the etching process, and the first thin film 103a is not etched. Further, when performing the etching process on the second thin film 120a, only the second thin film 120a may be selectively patterned by controlling an etching speed. By the process, the remaining segment of the second thin film 120a becomes the step difference alleviation pattern 120 after a subsequent process is performed. Hereinafter, for convenience of explanation, a shape in which the second thin film 120a is formed by the etching process is referred to as the step difference alleviation pattern 120.

Figure 4D:
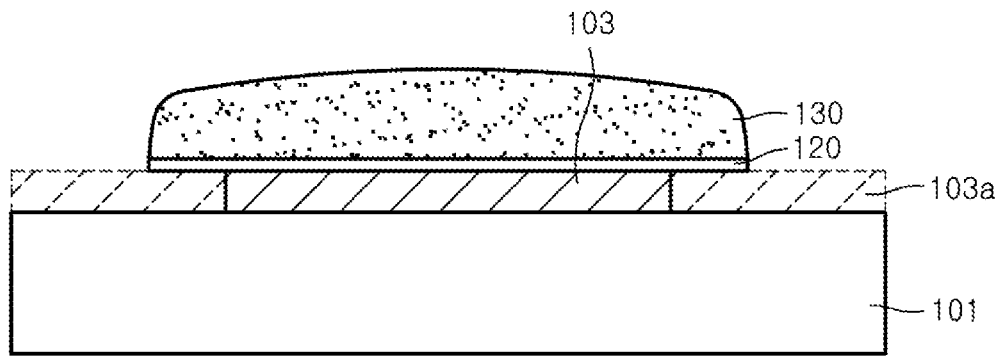

Referring to FIG. 4D, the first thin film 103a may be patterned by performing another etching process after the step difference alleviation pattern 120 is formed. As the first thin film 103a is selectively etched by the etchant, or the etching gas used for the etching process, the step difference alleviation pattern 120 is not etched. In order to create the alleviation segment 124 that has the gradual taper angle of a desired degree, the etching material, etching time, etching selectivity, and etching temperature, etc. for designing the first thin film 103a may be controlled. As a result, the lower thin film pattern 103 having a smaller line width than the step difference alleviation pattern 120 may be formed by excessively etching the first thin film 103a.

Figure 4E:
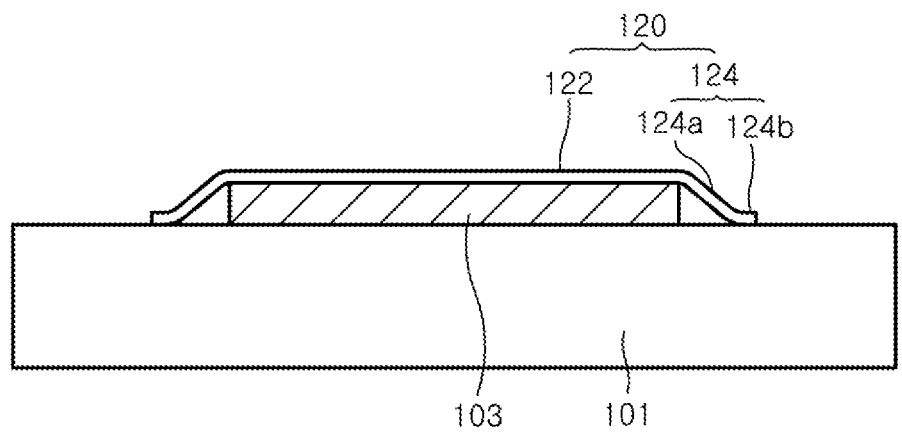

Referring to FIG. 4E, the photoresist pattern 130 is removed by performing a strip process using acetone, etc. or an ashing process after the lower thin film pattern 103 is formed. As the segment that does not overlap with the lower thin film pattern 103 in the step difference alleviation pattern 120 comes in contact with the substrate 101 by the van der Waals force, the casimir force, and the capillary force, the alleviation segment 124 of the step difference alleviation pattern 120 is formed. As a result, the step difference alleviation pattern 120 including the horizontal segment 122 overlapping with the lower thin film pattern 103, the inclined segment 124a extended from the horizontal segment 122 and having the gradual taper angle, and the edge segment 124b being connected to the inclined segment 124a and directly being in contact with the substrate 101 is completed.

Figure 4F:
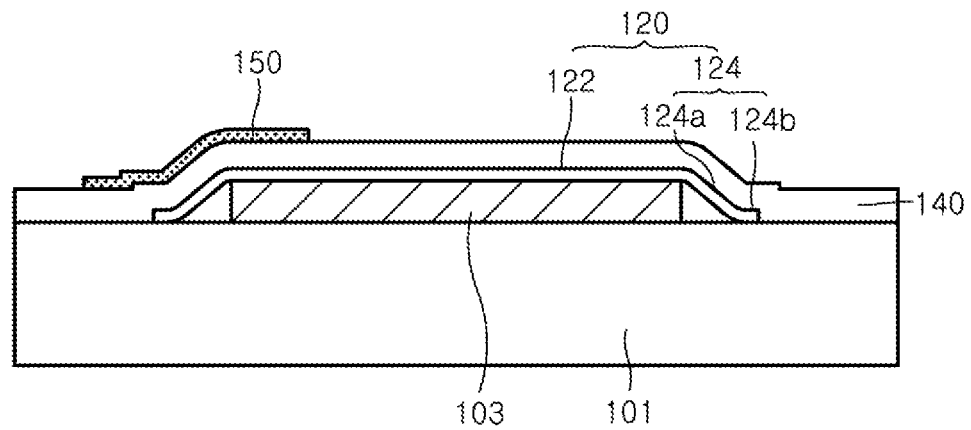

Referring to FIG. 4F, the insulating layer 140 and the upper thin film pattern 150 is sequentially formed on the step difference alleviation pattern 120. Here, as the inclined segment 124a of the step difference alleviation pattern 120 alleviates the step difference between the substrate 101 and the lower thin film pattern 103, the insulating layer 140 and the upper thin film pattern 150 does not have an abrupt step difference. Further, the insulating layer 140 and the upper thin film pattern 150 may be formed to have a uniform width.

Because the method of manufacturing the thin film pattern array shown in FIGS. 4A to 4F forms the step difference alleviation pattern 120 with one mask without adding a separate mask process, the method has a significant advantage in lowering manufacturing cost. However, the method of forming the step difference alleviation pattern 120 is not limited to the method shown in FIGS. 4A to 4F, and the method may include a separate mask process and use a process such as a launch process.

Figure 5:
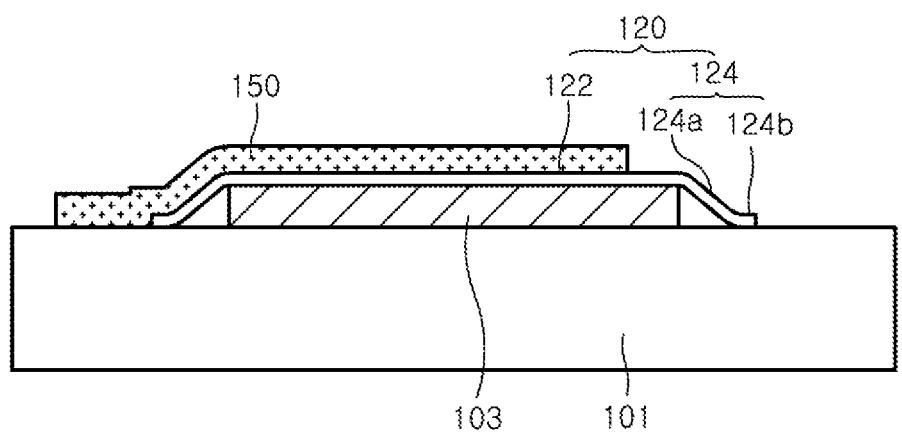
FIG. 5 is a cross-sectional view illustrating a thin film pattern array according to another embodiment of the present invention.

FIG. 5 is a cross-sectional view illustrating a thin film pattern array according to another embodiment of the present invention.

The thin film pattern array shown in FIG. 5 has a structure in which the lower thin film pattern 103, the step difference alleviation pattern 120, and the upper thin film pattern 150 are sequentially stacked on the substrate 120. The lower thin film pattern 103 and the upper thin film pattern 150 are formed of a conductive metal material and are electrically connected to one another other. The step difference alleviation pattern 120 has the same structure and function as the step difference alleviation pattern 120 shown in FIG. 3. That is, the step difference alleviation pattern 120 may include the horizontal segment 122 overlapping with the lower thin film pattern 103, and the alleviation pattern 124 extended from the horizontal segment 122 and having the gradual taper angle. Further, the alleviation segment 124 may include the inclined segment 124a connected to the horizontal segment 122 and having the gradual slope and the edge segment 124b connected to the inclined segment 124a and directly in contact with the substrate 101. The alleviation segment 124 of the step difference alleviation segment 120 performs a function of alleviating the step difference between the upper thin film pattern 150 and the lower thin film pattern 103. As a result, the upper thin film pattern 150 may have the uniform width without the abrupt step difference and be formed.

The method of manufacturing the thin film pattern array shown in FIG. 5 is formed by the same method described above with reference to FIGS. 4A to 4F except the process of forming the insulating layer 140. That is, instead of forming the insulating layer 140 after forming the lower thin film pattern 103 and the step difference alleviation pattern 120, the upper thin film pattern 150 is directly formed on the substrate 101. Accordingly, the upper thin film pattern 150 may be electrically connected to the lower thin film pattern 103.

Figure 6:
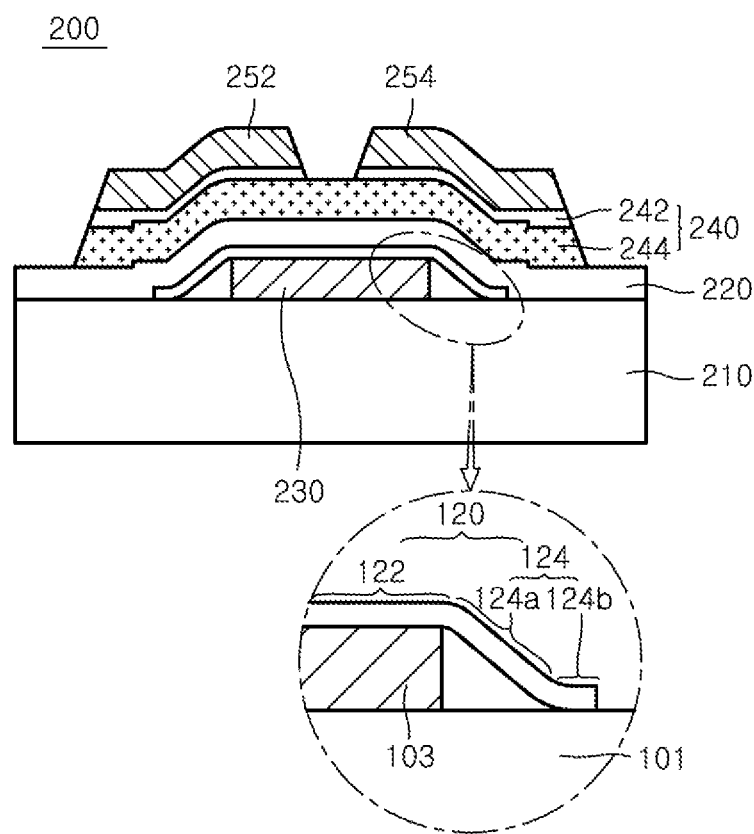
FIG. 6 is a cross-sectional view illustrating a thin film transistor to which a thin film pattern array according to an embodiment of the present invention is applied.

FIG. 6 is a cross-sectional view illustrating a thin film transistor to which a thin film pattern array according to an exemplary embodiment of the present invention is applied.

A thin film transistor 200 shown in FIG. 6 includes a gate electrode 230 formed on the substrate 210, a gate insulating film 220 formed to cover the gate electrode 230, a source electrode 252 and a drain electrode 254 facing each other, and an active layer 244 overlapping with the gate electrode 230 that forms a channel between the source electrode 252 and the drain electrode 254. The active layer 244 overlaps with the source electrode 252 and the drain electrode 254 which further includes a channel segment between the source electrode 252 and the drain electrode 254. An Ohmic contact layer 242 for an Ohmic contact between the source electrode 252 and the drain electrode 254 is further formed on the active layer 244. Here, the active layer 244 and the Ohmic contact layer 242 may be referred to as a semiconductor pattern 240. The gate insulating film 220 is located between the gate electrode 230 and the semiconductor pattern 240. The gate insulating film 220 electrically insulates the gate electrode 230 and the semiconductor pattern 240.

The step difference alleviation pattern 120 for alleviating the step difference is located between the upper surface of the gate electrode 230 and the upper surface of the substrate 210 in the thin film transistor 200 and has the structure as is described above. The step difference alleviation pattern 120 includes the horizontal segment 122 overlapping with the gate electrode 230 and the alleviation segment 124 extended from the horizontal segment 122 that has the gradual taper angle. Further, the alleviation segment 124 includes the inclined segment 124a connected to the horizontal segment 122 which has the gradual slope. Also, the edge segment 124b is connected to the inclined segment 124a and is directly in contact with the substrate 101. The structure of the step difference alleviation pattern 120 having the structure is practically the same as that of the step difference alleviation pattern 120 shown in FIGS. 1 and 2.

As the step difference alleviation pattern 120 alleviates the abrupt step difference formed by the gate electrode 230, various thin film patterns constituting the thin film transistor 200 such as the gate insulating film 220, the semiconductor pattern 240, the source electrode 252, and the drain electrode 254, etc. sequentially formed on the gate electrode 230 may have uniform widths. As a result, a heat problem due to the resistance generated by the step difference does not occur and the thin film transistor may be made routinely since the electrical signals are transmitted consistently between the thin film patterns.

The thin film pattern array according to an embodiment of the present invention is not limited to the thin film transistor and may be applied to any technology to which the stack structure between the thin films is applied.

While the present invention is described with reference to the above-described embodiments, it will be apparent to those skilled in the art that various modifications can be made to the above-described embodiments of the present invention without departing from the spirit or scope of the invention and all such modifications and changes are included in the scope of the appended claims and their equivalents.

The invention claimed is:

1. A thin film pattern array comprising:
a substrate;
a first film disposed on the substrate;
a step film disposed on the first film and the step film having a parallel segment, an inclined segment, and an edge segment, wherein the inclined segment has a taper angle with respect to the substrate and the edge segment is in contact with the substrate; and
a second film disposed on the step film,
wherein the first film has a shorter length compared to the step film, and an empty space is defined between the inclined segment and the substrate, and wherein the second film has a uniform thickness.

2. The thin film pattern array of claim 1, wherein the step film comprises:
a parallel segment being in contact with the first film; and
the inclined segment is connected to the parallel segment and extended beyond the first film and has no contact with the first thin film, and the edge segment is extended from the inclined segment and is in contact with the substrate.

3. The thin film pattern array of claim 1, wherein a third film is disposed on at least a part of the second film, and wherein the second film is an insulating layer, and electrically insulates the first thin film and the step film from the third film.

4. The thin film pattern array of claim 1, wherein the step film includes an anti-reflection material or an adhesive material.

5. The thin film pattern array of claim 1, wherein the step film includes at least one of silicon nitride (SiNx) and silicon oxide ($SiO_2$).

6. A method of manufacturing a thin film pattern array, the method comprising:
forming a first film on a substrate;
forming a flat film on the first film;
forming a photoresist pattern on the flat film by a photolithography process;
removing a portion of the flat film to the extent that does not overlap with the photoresist pattern using the photoresist pattern as a mask;
performing excessive-etching selectively on the first film so that the first film has a shorter length on the substrate compared to the flat film and an opening is formed underneath the flat film;
removing the photoresist pattern on the flat film by performing a strip process;
by using at least one of a van der Waals force, a casimir force, and a capillary force, forming a step film from the flat film as a part of the flat film is bent and is in contact with the substrate,
wherein the step film comprises a parallel segment, an inclined segment, and an edge segment,
wherein the parallel segment is in contact with the first film, the inclined segment has a taper angle with respect to the substrate, and an empty space is formed between the inclined segment and the substrate, and the edge segment is in contact with the substrate.

7. The method of manufacturing the thin film pattern array of claim 6, further comprising:
forming a second film on the step film, wherein the second film is an insulating layer; and
forming a third film disposed on the second film wherein the third film is electrically separated from the first film by the second film.

8. The method of manufacturing the thin film pattern array of claim 6, further comprising:
forming a third film disposed on the step film and electrically connected to the first film.

9. The thin film pattern array of claim 1, wherein the edge segment has a rounded shape.

10. The method of manufacturing the thin film pattern array of claim 6, further comprising:
forming a second film on the step film, wherein the second film has a uniform thickness.

11. A method of manufacturing a thin film pattern array, the method comprising:
forming a first film on a substrate;
forming a flat film on the first film;
forming a photoresist pattern on the flat film;
removing a portion of the flat film to the extent that does not overlap with the photoresist pattern;
etching the first film so that the first film has a shorter length on the substrate compared to the flat film and an opening is formed underneath the flat film;
removing the photoresist pattern on the flat film; and
forming a step film from the flat film,
wherein the step film comprises a parallel segment, an inclined segment, and an edge segment,
wherein the parallel segment is in contact with the first film, the inclined segment has a taper angle with respect to the substrate, and an empty space is formed between the inclined segment and the substrate, and the edge segment is in contact with the substrate.

12. The method of manufacturing the thin film pattern array of claim 10, further comprising:
forming a second film on the step film, wherein the second film has a uniform thickness.

* * * * *